United States Patent [19]

Orcutt

[11] Patent Number: 4,463,217

[45] Date of Patent: Jul. 31, 1984

[54] PLASTIC SURFACE MOUNTED HIGH PINOUT INTEGRATED CIRCUIT PACKAGE

[75] Inventor: John W. Orcutt, Garland, Tex.

[73] Assignee: Texas Instruments Incorporated, Dallas, Tex.

[21] Appl. No.: 301,856

[22] Filed: Sep. 14, 1981

[51] Int. Cl.³ .............................................. H05K 5/00
[52] U.S. Cl. .................................. 174/52 FP; 357/74
[58] Field of Search ............... 174/52 FP; 357/70, 74; 29/827; 339/17 CF

[56] References Cited

U.S. PATENT DOCUMENTS

| | | | |
|---|---|---|---|
| 3,416,348 | 12/1968 | Carter, Jr. et al. | 174/52 FP X |
| 3,614,546 | 10/1971 | Avins | 357/74 X |
| 4,059,810 | 11/1977 | Paletto | 174/52 FP X |
| 4,195,193 | 3/1980 | Grabbe | 174/52 FP |
| 4,393,581 | 7/1983 | Cherian | 339/17 CF X |

Primary Examiner—J. V. Truhe
Assistant Examiner—D. A. Tone

Attorney, Agent, or Firm—Douglas A. Lashmit; N. Rhys Merrett; Melvin Sharp

[57] ABSTRACT

A surface mounted integrated (IC) device package or carrier is disclosed suitable for accommodating large terminal count IC devices in a small space. A carrier, preferably of plastic, is disclosed having notches or castillations in its sides. A first row of leads are positioned in the periphery of the package and a second row of leads are positioned in the notches, said notches formed a predetermined distance from the periphery of the package (e.g., 0.050"). Selected leads of the second row are alternated with said first row of leads. In the preferred embodiment, the first and second leads are separated by 0.025". Also in the preferred embodiment, the first and second row of leads extend over protuberances into depressions in the bottom of the package. Each of the depressions is separated by ribs from the other depressions such that the ends of the leads are disposed in the depressions and are prevented from substantial movement, thereby preventing contact with adjacent leads.

3 Claims, 12 Drawing Figures

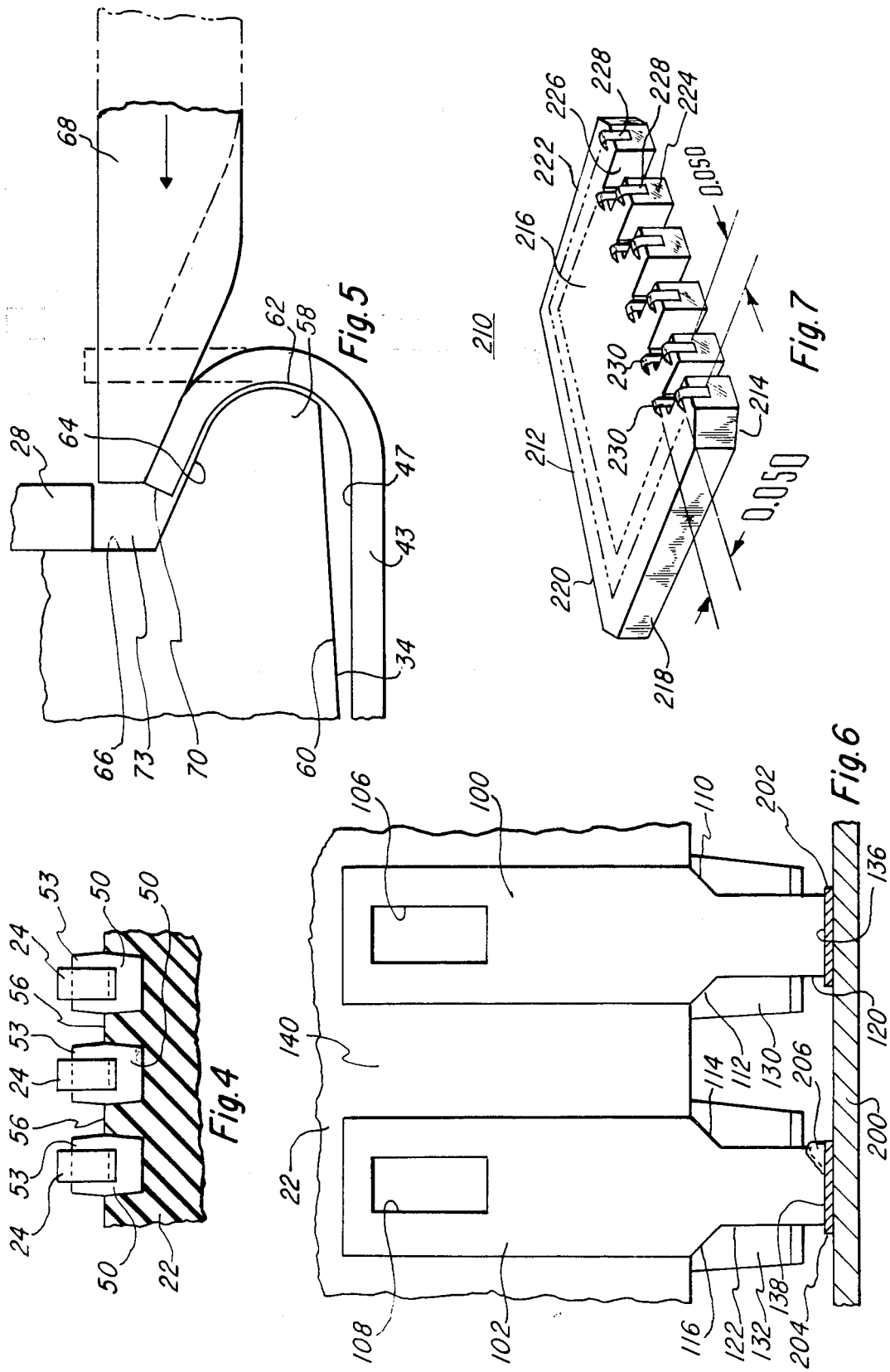

PLASTIC SURFACE MOUNTED HIGH PINOUT INTEGRATED CIRCUIT PACKAGE

This invention relates to an electronic packaging concept and more particularly to a high terminal count integrated circuit device package.

In an integrated circuit, a number of active semiconductor devices are formed on a chip of silicon and interconnected in place by leads to form a complete circuit. As integrated circuit technology has advanced over the years, yields have increased to the point that large arrays of logic circuits can be produced on a single semiconductor slice. Second and third level interconnections can be used to interconnect the individual circuits as desired and provide bonding pads at the edge of the slice. However, these circuit arrays usually require a large number of external connections. Terminal counts in excess of 100 are now required for gate arrays, microprocessors and very high speed integrated circuit (VHSIC) devices.

In the past, integrated circuit chips have been packaged in a variety of ways. The most common packages are the flatpack, the dual-in-line, the hermetic and plastic chip carrier and the grid array packages. The flatpack package is not a standardized package in the industry and has thus been generally produced to meet the requirements of a specific device. Leads generally extend from two opposing sides of the package and are generally either on 0.100" or 0.050" centers. These flatpack packages therefore become increasing inefficient and cumbersome to handle as terminal count increases. Some flatpacks have been designed with leads extending from all four sides; however, this design, although an improvement, produces a package which is still very inefficient, expensive and difficult to handle.

Dual-in-line packages have been the accepted standard for packaging integrated circuit chips. Terminals are located on two opposing sides of the package and are configured to extend downward from the package body and through holes in the printed wiring board (PWB) or other suitable substrate. These holes are generally plated through, and when the leads are soldered to them form the interconnection points to the rest of the circuitry. However, dual-in-line packages with terminal counts higher than 64 are not considered to be practical, for a number of reasons, the most notable of which are expense, package fragility and handling, and packaging efficiency. Dual-in-line packages have not been standardized for terminal counts greater than 64 therefore.

The chip carrier is normally square with terminals arranged either on 0.040" or 0.050" centers on the periphery (all four sides) of the package. The chip carrier package is a surface mounted device and therefore no pins extend through the substrate to which the chip carrier is mounted; conductor traces therefore can be routed in any location under the chip package in lower substrate layers. This allows the routing of a high density board in relatively few layers. However, the one main disadvantage of high terminal chip carriers is that they are relatively inefficient in terms of terminal count versus package area. The package area of chip carriers with terminal counts above 84 is driven by terminal count and pinout spacing rather than chip size and therefore lose packaging efficiency.

The grid array (or space array) package is square like the chip carrier but terminals, normally in the form of pins, protrude from the bottom of the package only, and are designed to be inserted in plated-through-holes in a PWB or other suitable substrate. At present, these grid array packages are not standardized and are available in both leaded and leadless versions. Leads or terminals are generally on a 0.100" grid; however, with either version, leaded or leadless, one cannot visually inspect the solder joints underneath the body of the package. In other words, the solder joints on the top side of the PWB are hidden by the package body. For military applications, this is very serious and forces one to use expensive and potentially unreliable inspection techniques, such as X-ray. Another even more serious problem with the grid array package is that the tightly spaced grid of terminals extends completely through the PWB, thereby restricting this area of the PWB primarily to package interconnection conductor traces only. This has the effect of limiting the potential effectiveness of gate array and VLSI devices by limiting the number of devices that can be attached to a given PWB. Further, since the pins extend completely through the board, this effectively blocks off area which could be used for routing interconnection conductor traces. This will increase the number of layers in the PWB and, ultimately, the cost of the PWB.

A variation of the leadless grid array package utilizes metallized holes through the body of the package which is designed to fit over pins mounted into a PWB. This approach still suffers from the PWB routability problem, and the hidden solder joint problem still exists.

Accordingly, it is an object of the present invention to provide a surface mounted IC device package having a very large number of external leads in a very small area.

Another object of the present invention is to provide a surface mounted IC package having a plurality of notches therein to accommodate a first set of leads on the periphery of the package and a second set of leads in said notches.

Another object of the present invention is to provide an IC device package which does not limit the routing density of the printed wiring board (PWB) or other substrate to which it is attached.

Another object of the present invention is to provide an IC device package having a high external terminal count which can be directly surface mounted to a PWB or suitable substrate without intervening pins or terminals.

Another object of the present invention is to provide an IC device package which may be easily mated with a standard PWB or other substrate.

Another object of the present invention is to provide an IC device package which mates with a PWB or other substrate in such a manner as to allow all attachment solder joints to be visually inspected.

Still another object of the present invention is to provide an IC device package which is practical to manufacture with current manufacturing equipment and which is both reliable and has high structural integrity.

Another object of the present invention is to provide an IC device package having a large number of external leads which may be economically manufactured.

Other objects and features of the invention will become more readily understood from the following detailed description and appended claims when read in conjunction with the accompanying drawings, in which like reference numerals designate like parts throughout the figures thereof, and in which:

FIG. 4 is a cross-sectional view taken along section line 4—4 of FIG. 2;

FIG. 5 is a cross-sectional view, on a slightly enlarged scale, taken along section line 5—5 of FIG. 2;

FIG. 6 is a partial view of the carrier of FIG. 1 showing a side view of two adjacent leads.

FIG. 7 is a perspective bottom view of the integrated circuit carrier according to the present invention;

FIGS. 1-6 provide background information for the construction of the carrier to be described hereinafter in FIGS. 7-12. For a more detailed description, reference should be made to U.S. patent application Ser. No. 286,833 filed July 27, 1981 entitled "Carrier for Integrated Circuit" and assigned to the same assignee as the present invention.

Figure 1:
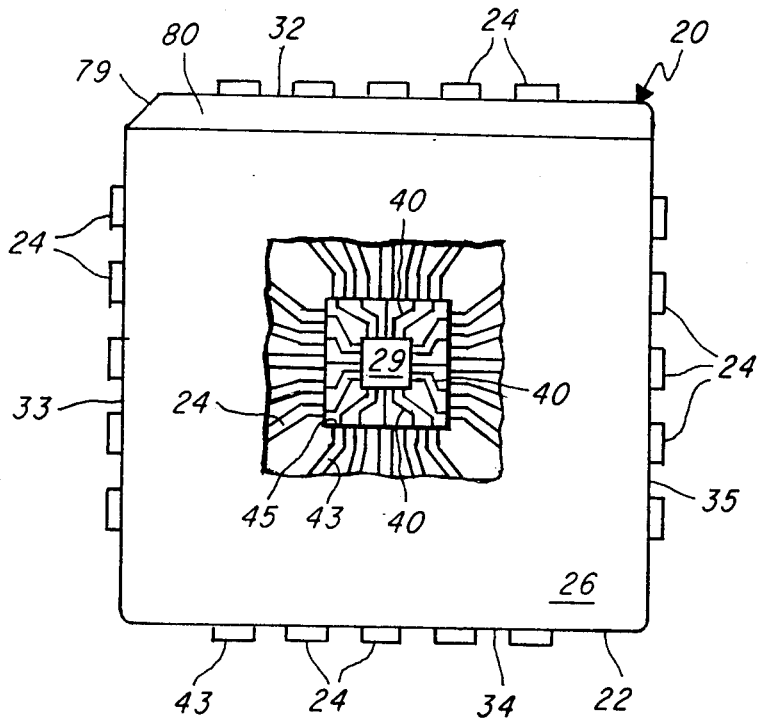
FIG. 1 is a top view of an integrated circuit carrier with portions broken away to reveal internal details (not to scale)
Figure 2:
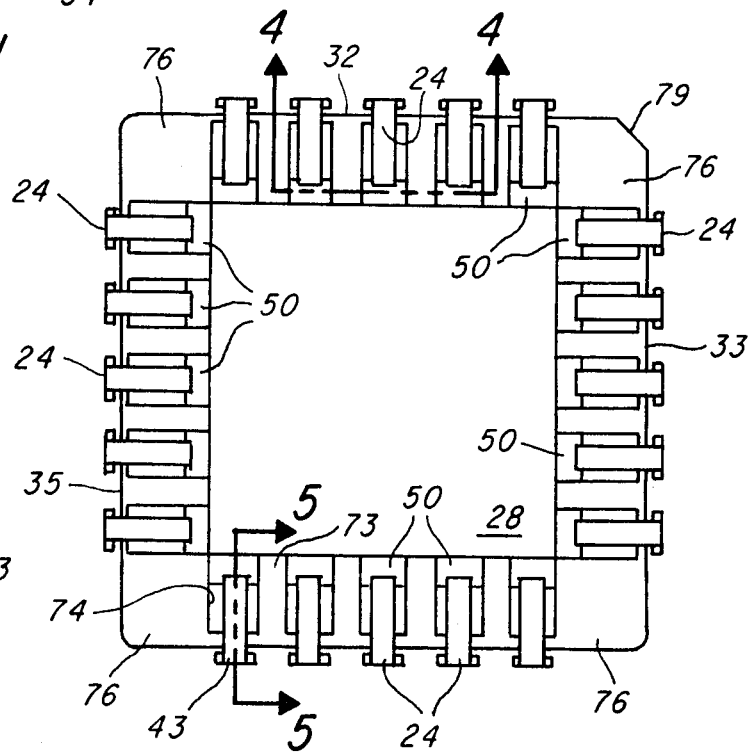
FIG. 2 is a bottom view of the chip carrier of FIG. 1.
Figure 3:
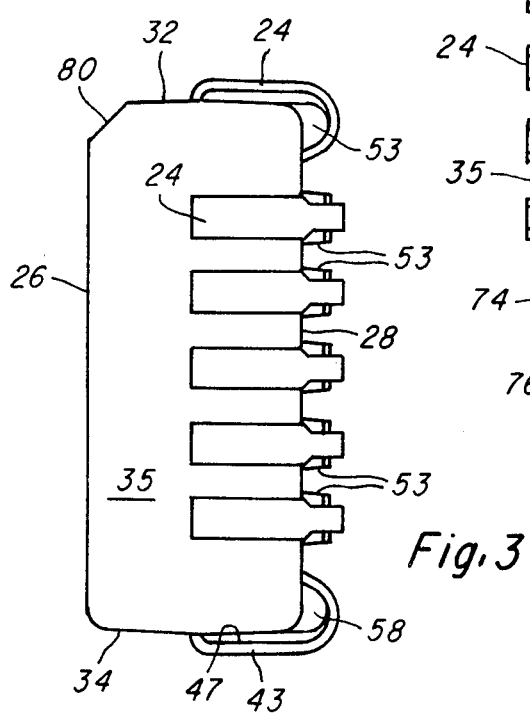
FIG. 3 is a side view of the chip carrier of FIGS. 1 and 2.

The carrier 20, as shown in FIG. 1, has a basically square shape. The carrier 20 includes an enclosure 22 and a plurality of leads 24. The leads can be constructed of an electrically conductive metallic material, for example, copper alloy. The enclosure 22 can be constructed from plastic, for example, epoxy plastic. The chip carrier can be of any convenient shape, however, as shown in FIGS. 1, 2 and 3, it has a generally flat box shape with a top 26, a bottom 28, and four lateral sides 32 through 35 with top 26 and bottom 28 square and lateral sides 32 through 35 rectangular shape. A portion of the top 26 in FIG. 1 has been broken away to reveal an integrated circuit 29 attached to the leads 24 by a plurality of fine bonding wires 40.

All of the leads 24 are similar and a discussion of a particular lead 43 shall suffice for all. One end 45 of lead 43 is located adjacent to integrated circuit 29 and is connected thereto by one of the bonding wires 40. Lead 43 extends through lateral side 34 (as shown in FIG. 3) at approximately half of the distance between the top 26 and the bottom 28 of the enclosure 22. The lead 43 has flat side 47 (FIGS. 3 and 4).

The corners connecting the lateral sides 32 through 35 can be any convenient shape such as rounded, sharp, or beveled. Lateral sides 32 and 34 form a pair of lateral sides which are parallel and have approximately the same dimensions. Lateral sides 33 and 35 form a pair of lateral sides which are parallel and also have approximately the same dimensions.

Lead 43 extends from its end 45 within the enclosure 22 out lateral side 34 (as shown in FIG. 3) and extends along lateral side 34 toward bottom 28 with flat side 47 thereagainst. All the leads 24 exit the enclosure at approximately the midpoint between the top 26 and the bottom 28 with flat side 47 thereagainst. The bottom 28 (as shown in FIG. 2) is provided with a plurality of depressions 50. Each depression is separated from the other depressions by a portion of the bottom 28 which is at the same level as the remainder of the bottom. Specifically as shown herein, the separating portion is slightly above the remainder of the bottom, although it can be lower than the remainder. Also, the protuberance can have the same level as the bottom if deeper depressions are provided. The leads 24 extend to an end located in the depressions 50 as shown in FIG. 2.

In FIG. 3, the leads 24 are shown extending along the lateral sides over a plurality of protuberances 53. The protuberances 53 can be arranged along each lateral side to form a single projection which extends beyond the bottom 28. The protuberances have one slope side which is coplanar with the lateral side from which it extends. Each lead extends over its associated protuberance into one of the depressions 50. One of the depressions 50 is associated with each of the protuberances which in turn is associated with one of the leads. If the protuberances are formed into a single projection, then it is only necessary that one of the depressions is associated with each of the leads.

As shown in FIG. 4, each of the leads 24 extends over a projection 53 into a depression 50. Each depression is separated by a portion of the bottom which is at approximately the same level as the bottom (but slightly above) which forms ribs 56. The ends of the leads 24 are thus substantially constrained from movement parallel to the plane of the lateral side, through which it extends, by the ribs 56. The rib 56 thus supports leads 24 and prevents adjacent leads of leads 24 from coming into contact. Since the ribs provide support against lateral movement, the leads can be constructed of a thinner material.

Lead 43, as shown in FIG. 5, extends over its associated protuberance 58 with flat side 47 thereagainst. Protuberance 58 is similar to the other probuterances 53 and a detailed discussion of one protuberance shall suffice for all. A slope 60 of protuberance 58 has coplanarity with the lateral side 34. The lateral side 34 may have a small slope from its midpoint to its connection with bottom 28 of, for example, approximately three degrees. The protuberance extends from slope 60 through a rounded end 62. A slope 64 of protuberance 58 extends from rounded end 62 into a depression 66 which is one of the depressions 50. The slope 64 has an angle of approximately 25 degrees with respect to the lateral side 34. The slope 64 extends toward bottom 28 and away from lateral side 34 and generally toward lateral side 32 (FIG. 2).

Lead 43 is shown in FIG. 5 in two positions. First, lead 43 (as shown by the broken line) is bent over rounded end 62, then a punch 68 (shown by the broken line) contacts the portion of the lead extending beyond rounded end 62. The punch 68 (shown at its second position by a solid line) forces the lead to deform and move angularly to a position adjacent to slope 64 (shown by a solid line). The end 70 of lead 43 is now disposed within depression 66. The end 70 is prevented from lateral movement by ribs 73 and 74 (FIG. 2) of ribs 56. The corners 76 of bottom 28 are also raised to provide the ribs, for example, rib 74 in FIG. 2.

In FIG. 5, the punch moves from its first position at the right (as shown in FIG. 5) toward the second position (as shown in FIG. 5). This causes lead 43 to bend around and over rounded end 62 and into contact with or close proximity to slope 64. The lead 43 deforms and, even after punch 68 is removed from contact with lead 43, the end 70 remains closely adjacent to slope 64 with flat side 47 thereagainst.

If force is applied to pull lead 43 away from slope 60 and lateral side 34 of enclosure 22, the end 70 and the portion of lead 43 adjacent thereto contacts slope 64 to prevent such movement. After deformation by punch 68, flat side 47 does not move away from slope 60 as a result of a spring-back action after deformation since end 70 contacts slope 64. End 70 is protected from contact with other objects by being disposed within depression 66. The ends of the other leads 24 are also protected within their respective depressions 50.

The enclosure 22 has beveled edges 79 and 80 (FIG. 1) which are useful in aligning the carrier for proper connection of the leads to, for exmple, a printed circuit board.

As shown in FIG. 6, adjacent leads 100 and 102, which are two of leads 24, extend from enclosure 22. Leads 100 and 102 have openings or holes 106 and 108, respectively, located therein close to the exit of the leads out of enclosure 22. The holes as shown are rectangular; however, any convenient shape can be utilized. The holes provide increased flexibility to the leads. The leads 100 and 102 extend to downward (as shown in FIG. 5) to thinner portions 120 and 122, respectively. The lead 100 has tapered edges 110 and 112 to thinner portions 114 and 116. The thinner portions 120 and 122 extend over protuberances 130 and 132 into two of the depressions 50 (not shown in FIG. 6). The leads 100 and 102 can be attached by soldering to a printed circuit board 200 at the lower portion 136 and 138, respectively, over their respective protuberances.

When leads 100 and 102 are soldered to contact pads 202 and 204, respectively, of printed circuit board 200, lower portions 136 and 138 are in contact with contact pads 202 and 204. The solder 206 is attached to thinner portions 120 and 122 (only a portion of the solder is shown attached to lead 102). The solder can be applied to the leads on either or both sides of the thinner portions 120 and 122 from the contact at lower portions 136 and 138, respectively, with the printed circuit board 200. Soldering can be by reflow, dipping, wave, or other appropriate techniques.

The protuberances 130 and 132 provide support to the leads 100 and 102, respectively, when the contact is made with the printed circuit board or any other object, for example, another carrier during shipment or during insertion into a socket. The socket can provide for contact with the leads between the tapers and the entrance of the leads into the enclosure along the lateral sides of the enclosure 22. The protuberances 130 and 132 also limit the amount of solder which can accumulate between the leads 100 and 102, and enclosure 22 as a result of a wicking action to prevent the solder 206 from bridging between the adjacent leads 100 and 102.

The holes 106 and 108 allow the leads 100 and 102 to flex for compensating for changes in the dimensions of the printed circuit board due to thermal effects. The leads 100 and 102 are separated by an area 140. The distance across the area 140 between leads 100 and 102 is approximately equal to the width of lead 100. The lead 102 has a width approximately equal to lead 100. The width of the leads can exceed the space separating, i.e., area 140 or be slightly less than if the leads are not perfectly parallel. Thus, the width of area 140 can be slightly greater than, equal to, or less than the width of lead 100. These relative widths provide a spacing between leads which prevents a lead of another carrier (not shown) similar to carrier 20 from fitting or nesting between leads 100 and 102. The nesting can cause damage to the leads especially in automatic processing operations.

Figure 9:
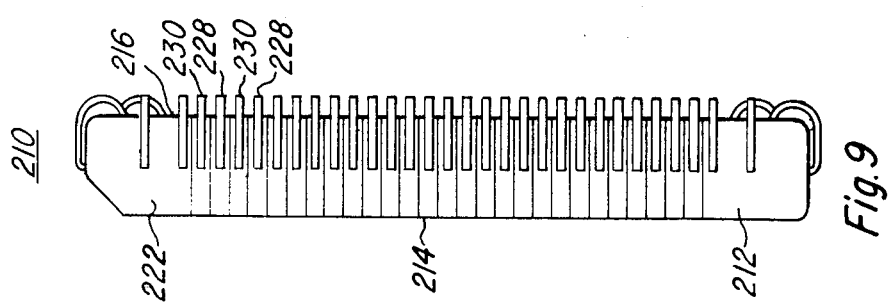
FIG. 9 is an end view of the carrier of FIG. 8.
Figure 8:
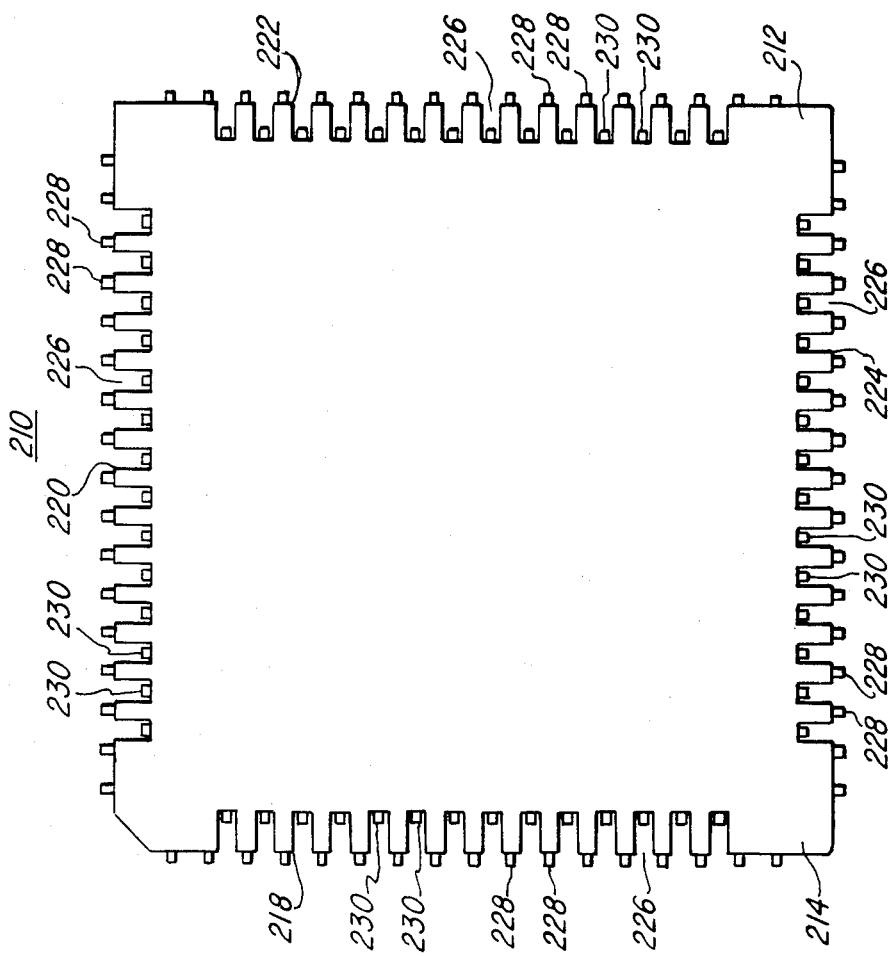
FIG. 8 is a top view of the carrier according to the present invention.

FIGS. 7-12 illustrate various views of the carrier 210 constructed according to the present invention. FIG. 7 illustrates a bottom perspective view of the carrier 210 while FIGS. 8 and 9 illustrate a top and end view, respectively. Carrier 210 has basically a square shape and includes an enclosure 212 which may be constructed from plastic, such as epoxy plastic, or other suitable material. Although enclosure 212 may be of any convenient shape, in the preferred embodiment, it has a generally flat box shape with a top 214 and a bottom 216 and lateral sides 218-224 of rectangular shape. A plurality of notches 226 or castillations are formed in enclosure 212 along its periphery and, in the preferred embodiment, are formed in the periphery of each of lateral sides 218-224; as can be seen in FIG. 8, notches 226, in the preferred embodiment, are also rectangular in shape. Typically, notches 226 are 0.050 inches in depth.

Figure 10:
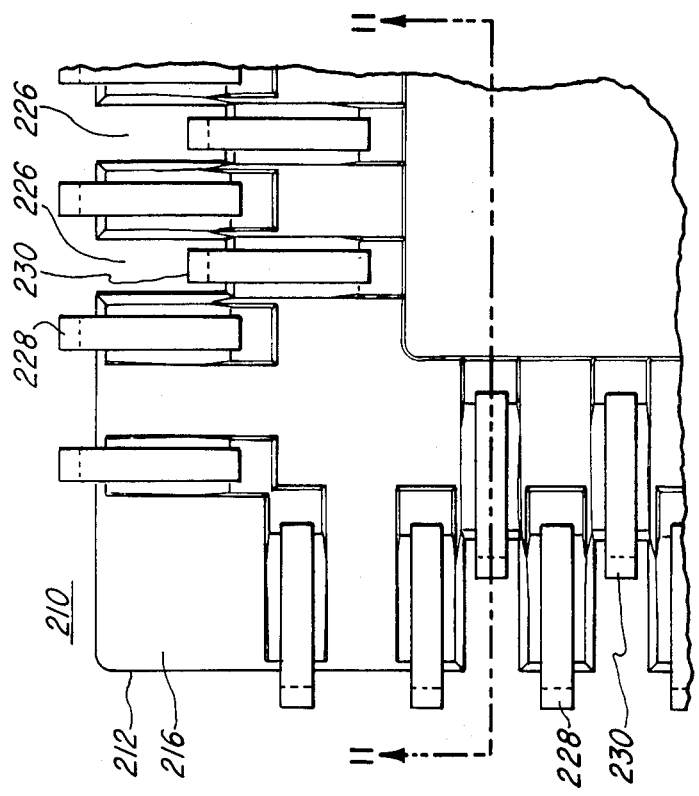
FIG. 10 is a detailed partial bottom view of the carrier of FIG. 7.

As can be seen more easily from FIGS. 7, 8 and 10, a first set or row of leads 228 are formed or located on the periphery of at least one lateral side 224 of enclosure 212. A second set or row of leads 230 are formed or located in notches 226. Leads 228 and 230 are essentially formed in the same manner. Each of the leads are connected inside enclosure 212 to an integrated circuit chip (not shown); leads 228 and 230 then extend through lateral sides 218-224 of enclosure 212. For each lead 228 and 230, a protuberance 232 which is parallel and coplanar with each lateral side 218-224 is provided. Protuberances 232 can be arranged along each lateral side to form a single projection which extends beyond the bottom 216. As can be seen more clearly in FIGS. 11 and 12, protuberances 232 extend beyond the bottom 216 and have rounded bends 234 around which each lead 228 and 230 is formed.

Figure 11:
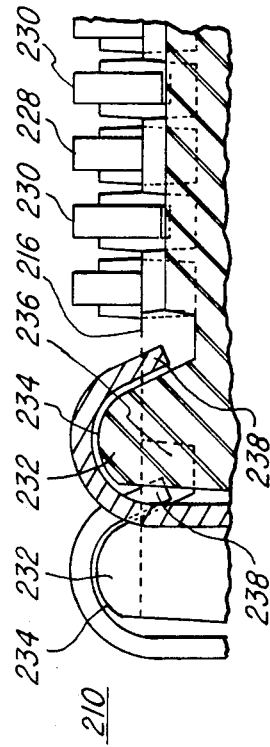
FIG. 11 is a cross-sectional view taken along section line 11—11 of FIG. 10.
Figure 12:
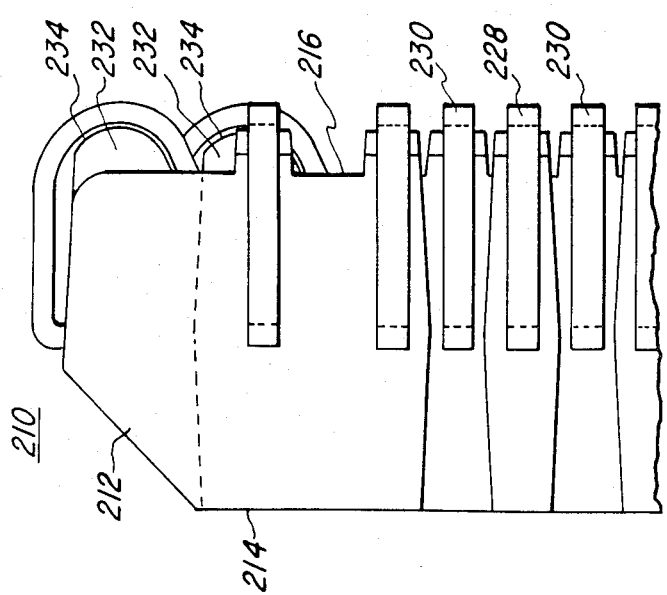
FIG. 12 is an enlarged detailed end view of the carrier of FIG. 10.

Referring again to FIG. 11, the bottom 216 of enclosure 212 is provided with a plurality of depressions 236. Each depression 236 is separated from other depressions by a portion of the bottom 216 which is at the same level as the remainder of the bottom. In the preferred embodiment, one of the depressions 50 is associated with each of the protuberances 232 which in turn is associated with one of the leads 228 or 230. As can be seen in FIG. 11, both the outer row of leads 228 on the periphery of enclosure 212 as well as the inner row of leads 230 formed in notches 226 are bent around each of the protuberances 232 such that the ends 238 of leads 228 and 230 are within depressions 236 and below the line formed by the bottom 216 of enclosure 212 to thereby prevent movement of the leads. The protuberances 232 and depressions 236 and the method of forming the leads 228 and 230 around the protuberances and into the depressions is described in more detail with respect to FIGS. 1-6.

As can be seen from FIG. 8, two rows of leads are formed on enclosure 212, namely the leads 228 on the periphery of enclosure 212 and the leads 230 formed in notches 226. In the preferred embodiment, the spacing between leads 228 is 0.050 inches while the spacing between the leads 230 is also 0.050 inches. The preferred spacing between leads 228 and 230 is 0.025 inches. The two rows of terminals staggered with respect to one another allows present state of the art spacing and lines for multilevel printed wiring boards to which carrier 210 would be attached. Although a first row of notches 226 is illustrated (in FIG. 8) an additional row of notches could also be formed further into the body of enclosure 212 to accommodate additional leads.

The advantage of the package 210 constructed according to the present invention is to spread the 25 mil center line leads by staggering them into two rows, 50 mils apart. By so doing, the carrier lead count can be increased dramatically. This can be shown more clearly from Table I set forth below:

TABLE I

| LEAD COUNT | | |
| --- | --- | --- |
| EXISTING CARRIERS | PLASTIC HIGH PINOUT CARRIER | CARRIER SIZE SQUARE |
| 20 | 28 | .350 |
| 28 | 44 | .450 |
| 44 | 76 | .650 |
| 52 | 92 | .750 |
| 68 | 124 | .950 |
| 84 | 156 | 1.150 |
| 100 | 188 | 1.350 |
| 124 | 236 | 1.650 |
| 156 | 300 | 2.050 |

Thus, it can be seen that the design of carrier 210 described hereinabove allows high lead counts to be realized in a very small area, does not limit the routing density of printed wiring boards since carrier 210 is surface mounted, allows all soldered joints to be visually inspected and allows the area under enclosure 212 to be cleaned with relative ease. Although the invention has been shown and illustrated in terms of a specific apparatus, it will be apparent the changes or modifications can be made without departing from the spirit and scope of the invention as defined by the appended claims.

What is claimed is:

1. An integrated circuit package comprising:
   an enclosure having a top and bottom and a plurality of lateral sides extending between said top and bottom, wherein a plurality of notches are formed in the periphery of each of said lateral sides;
   a first row of conductive leads on each of said lateral sides located on the periphery thereof, and a second row of conductive leads on each of said lateral sides in staggered relationship with said first row of leads;
   a plurality of rounded protuberances extending beyond said bottom of said enclosure, each of said protuberances being associated with a conductive lead of said first and second rows of conductive leads, and a plurality of depressions located adjacent each protuberance wherein the inner portion of each said protuberance slopes downward into its corresponding depression, whereby each of said conductive leads bends over one of said rounded protuberances and closely against said sloped inner portion into one of said depressions to prevent the movement of said conductive lead.

2. The integrated circuit package of claim 1 wherein said enclosure is formed of plastic.

3. The integrated circuit package of claim 2 wherein the top and bottom of said enclosure are substantially square and said lateral sides are substantially parallel.

* * * * *